(12) United States Patent
Åstrand

(10) Patent No.: US 8,119,262 B2
(45) Date of Patent: Feb. 21, 2012

(54) MULTILAYERED COATED CUTTING TOOL

(75) Inventor: Maria Åstrand, Storvreta (SE)

(73) Assignee: Sandvik Intellectual Property AB, Sandviken (SE)

( * ) Notice: Subject to any disclaimer, the term of this patent is extended or adjusted under 35 U.S.C. 154(b) by 602 days.

(21) Appl. No.: 12/003,337

(22) Filed: Dec. 21, 2007

(65) Prior Publication Data
US 2008/0166583 A1    Jul. 10, 2008

(30) Foreign Application Priority Data

Dec. 27, 2006    (SE) ..................... 0602814

(51) Int. Cl.
*B32B 9/00*    (2006.01)
(52) U.S. Cl. ............ 428/698; 51/307; 51/309; 428/216; 428/336; 428/697; 428/699
(58) Field of Classification Search ............ 51/307, 51/309; 428/216, 336, 697, 698, 699
See application file for complete search history.

(56) References Cited

U.S. PATENT DOCUMENTS

| | | | |
|---|---|---|---|
| 6,103,357 A * | 8/2000 | Selinder et al. | 428/216 |
| 6,586,122 B2 * | 7/2003 | Ishikawa et al. | 51/307 |
| 6,824,601 B2 * | 11/2004 | Yamamoto et al. | 428/698 |
| 7,056,602 B2 * | 6/2006 | Hörling et al. | 428/699 |
| 7,083,868 B2 * | 8/2006 | Hörling et al. | 428/697 |
| 7,348,074 B2 * | 3/2008 | Derflinger | 428/699 |
| 7,410,707 B2 * | 8/2008 | Fukui et al. | 51/309 |
| 7,510,761 B2 * | 3/2009 | Kondo et al. | 51/307 |
| 7,537,822 B2 * | 5/2009 | Ishikawa | 428/697 |
| 7,592,076 B2 * | 9/2009 | Flink et al. | 428/697 |
| 7,597,951 B2 * | 10/2009 | Björmander et al. | 428/336 |

(Continued)

FOREIGN PATENT DOCUMENTS

EP    0 885 984 A2    12/1998

(Continued)

OTHER PUBLICATIONS

European Search Report dated May 23, 2008, issued in European Appln. No. EP 07 12 2622.

(Continued)

*Primary Examiner* — Archene Turner
(74) *Attorney, Agent, or Firm* — Morgan, Lewis & Bockius LLP

(57) ABSTRACT

The present invention relates to a coated cutting tool wherein a substrate is coated with a thin, adherent, hard and wear resistant coating comprising a laminar, multilayered structure of alternating layers of metalnitrides, metalcarbides or metalcarbonitrides. In the coating the sequence of individual layer thicknesses has no repeat period but is essentially aperiodic throughout the entire multilayered structure. The average chemical composition of the coating was $Al_a Ti_b Si_c Cr_d (C_e N_{1-e})$ where a is greater than zero and less than about 0.5, preferably a is greater than about 0.05 and less than about 0.4, where b is greater than about 0.1 and less than about 0.9, preferably b is greater than about 0.3 and less than about 0.9, where c is greater than about 0.01 and less than about 0.17, preferably c is greater than about 0.02 and less than about 0.1, where d is greater than or equal to zero and less than about 0.06, and $a+b+c+d=1$, where e is greater than or equal to zero and less than about 1, preferably e is greater than or equal to zero and than about 0.2.

17 Claims, 2 Drawing Sheets

U.S. PATENT DOCUMENTS

2006/0222893 A1  10/2006  Derflinger
2007/0275179 A1* 11/2007  strand et al. .................. 427/524

FOREIGN PATENT DOCUMENTS

| | | | |
|---|---|---|---|
| EP | 1 219 723 | | 7/2002 |
| EP | 1 690 959 | | 8/2006 |
| EP | 1 698 714 A2 | | 9/2006 |
| EP | 1 702 997 | | 9/2006 |
| EP | 1 726 686 A1 | | 11/2006 |
| EP | 1736565 | * | 12/2006 |
| JP | 11-12718 A | | 1/1999 |
| JP | 2001-521447 A | | 11/2001 |
| JP | 2003-175405 | | 6/2003 |
| JP | 2006-137982 A | | 6/2006 |
| JP | 2006-152321 | | 6/2006 |
| JP | 2006-181706 | * | 7/2006 |
| WO | WO 98/48072 | | 10/1998 |
| WO | WO 2006/041366 A1 | | 4/2006 |
| WO | WO 2006/08088 A1 | | 8/2006 |

OTHER PUBLICATIONS

Office Action issued Dec. 21, 2010, in Japanese Application No. 2007-334294 (with English language translation).

* cited by examiner

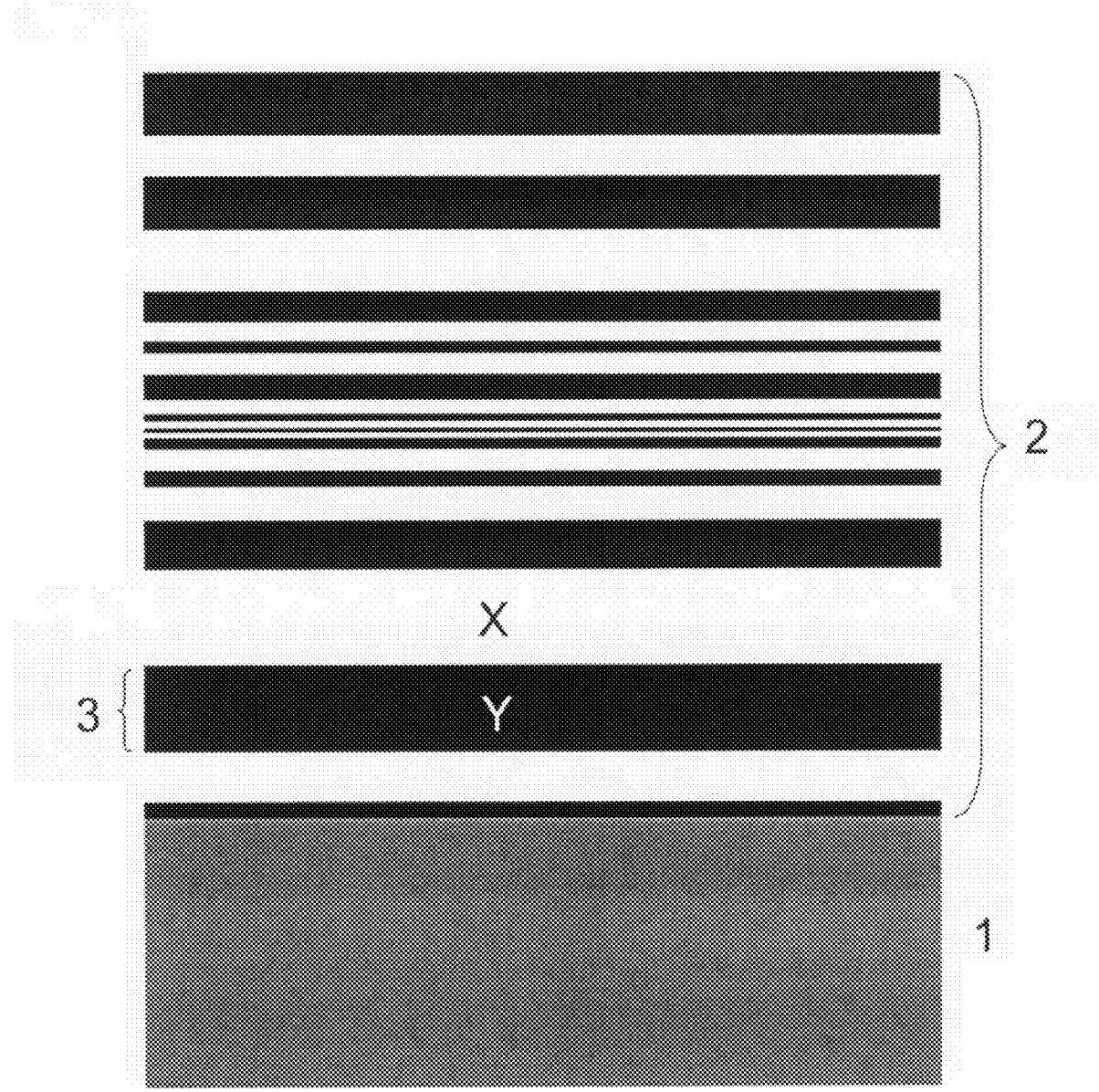

MULTILAYERED COATED CUTTING TOOL

BACKGROUND OF THE INVENTION

The present invention relates to a cutting tool for metal machining, comprising a substrate of cemented carbide, cermet, ceramics, high speed steel or cubic boronitride and, on the surface of said substrate, a hard and wear resistant refractory coating deposited by Physical Vapor Deposition (PVD). The coating is adherently bonded to the substrate and comprises a laminar, multilayered structure of alternating metal nitrides, metal carbides or metal carbonitrides as individual layers, having an aperiodic structure and an average Si content of from about 1 to about 17 at %.

The methods of depositing a thin refractory coating (from about 1 to about 20 μm) of materials like alumina ($Al_2O_3$), titanium carbide (TiC) and/or titanium nitride (TiN) onto, e.g., a cutting tool of cemented carbides, cermets, ceramics, cubic boronitride or high speed steels are well established technologies and the tool life of the coated cutting tool, when used in metal machining, is considerably prolonged. The prolonged service life of the tool may under certain conditions extend up to several hundred percent. Modern commercial cutting tools are characterised by a plurality of layer combinations with double or multilayer structures. The total coating thickness varies between about 1 and about 20 micrometers (μm) and in the prior art, the multilayered structure is characterised in the nanometer (nm) and/or micrometer range (μm), i.e., the thickness of the individual layers varies between a few nanometers and a few hundreds of a nanometers.

There exist several PVD techniques capable of producing refractory thin layers on cutting tools and the most established methods are ion plating, magnetron sputtering, arc discharge evaporation and IBAD (Ion Beam Assisted Deposition). Each method has its own merits and the intrinsic properties of the produced coating such as microstructure/grain size, hardness, state of stress, cohesion and adhesion to the underlying substrate may vary depending on the particular PVD method chosen. An improvement in the wear resistance or the edge integrity of a PVD coated cutting tool being used in a specific machining operation can thus be accomplished by optimizing one or several of the above mentioned properties.

With nanocomposite nitride, carbide or carbonitride hard coating materials, it is understood a multilayered coating where the thickness of each individual nitride, carbide or carbonitride layer is in the nanometer range, usually below 100 nm.

The recent development within tools has been towards sharper cutting edges. This requires thinner coatings in order to maintain the sharp cutting edges. If the coating is too thick, the edge easily gets a more round shape. If a thinner coating is deposited, an increased hardness is required to maintain the wear resistance. One way to achieve a thin hard coating is to use a multilayered nanocomposite coating. In prior art, this nanocomposite coating has usually been deposited onto a homogeneous wear resistant layer.

EP 1 690 959 A discloses a wear resistant coating comprising a single phase structure bottom layer of TiAlSiN having a thickness of from about 2 to about 6 μm and a top layer of a multilayered structure $Ti_{1-(A+B)}Al_ASi_BN/Ti_{1-(C+D)}Al_CSi_DN$ having a total thickness of from about 0.5 to about 1.5 μm. The composition of the multilayered structure is described with A in the range of from about 0.01 to about 0.06, B in the range of from about 0.25 to about 0.35, C in the range of from about 0.30 to about 0.45 and D in the range of from about 0.1 to about 0.15.

EP 1 702 997 A discloses a hard film for cutting tools composed of $Ti_{1-a-b-c-d}Al_aCr_bSi_cB_d(C_{1-e}N_e)$ where 0.5<a<0.8, b>0.06, c is from about 0 to about 0.1, 0<d<0.1 and 0.5<e<1. The hard film can be in the form of a multilayered structure.

However, further development of multilayered coatings is still required to be able to provide coatings with improved wear resistance while still having a sharp cutting edge.

OBJECTS AND SUMMARY OF THE INVENTION

It is an object of the present invention to provide a cutting tool having a wear resistant coating.

It is yet another object of the present invention to provide a coating having an increased hardness.

It is yet another object of the present invention to provide a coating which is suitable for sharp edges.

In accordance with the invention there is provided a cutting tool comprising a substrate of sintered cemented carbide or cermet, ceramic, cubic boronitride or high speed steel comprising a thin, adherent, hard and wear resistant coating, said coating comprising a laminar, multilayered structure of alternating layers of refractory compounds in non-repetitive form, X+Y+X+Y+X . . . where the alternating layers X and Y are composed of metalnitrides, metalcarbides or metalcarbonitrides, the sequence of individual layer thicknesses having no repeat period but being essentially aperiodic throughout the entire multilayered structure wherein said individual X or Y layer thickness is larger than about 0.1 nm but smaller than about 100 nm, varying essentially at random, and the total thickness of said multilayered coating is from about 0.5 μm to about 20 μm, the multilayered structure having an average chemical composition of $Al_aTi_bSi_cCr_d(C_eN_{1-e})$ where a is greater than zero and less than about 0.5, b is greater than about 0.1 and less than about 0.9, c is greater than about 0.01 and less than about 0.17, c is equal to or greater than zero and less than about 0.06, and a+b+c+d=1, where e is equal to or greater than zero and less than about 1.

BRIEF DESCRIPTION OF THE DRAWINGS

FIG. 2 shows a schematic picture of a substrate 1 coated with a laminar, multilayered nitride coating 2 with the individual metalnitride layers being X and Y and an example individual layer thickness 3.

DETAILED DESCRIPTION OF THE PREFERRED EMBODIMENTS

Figure 1:
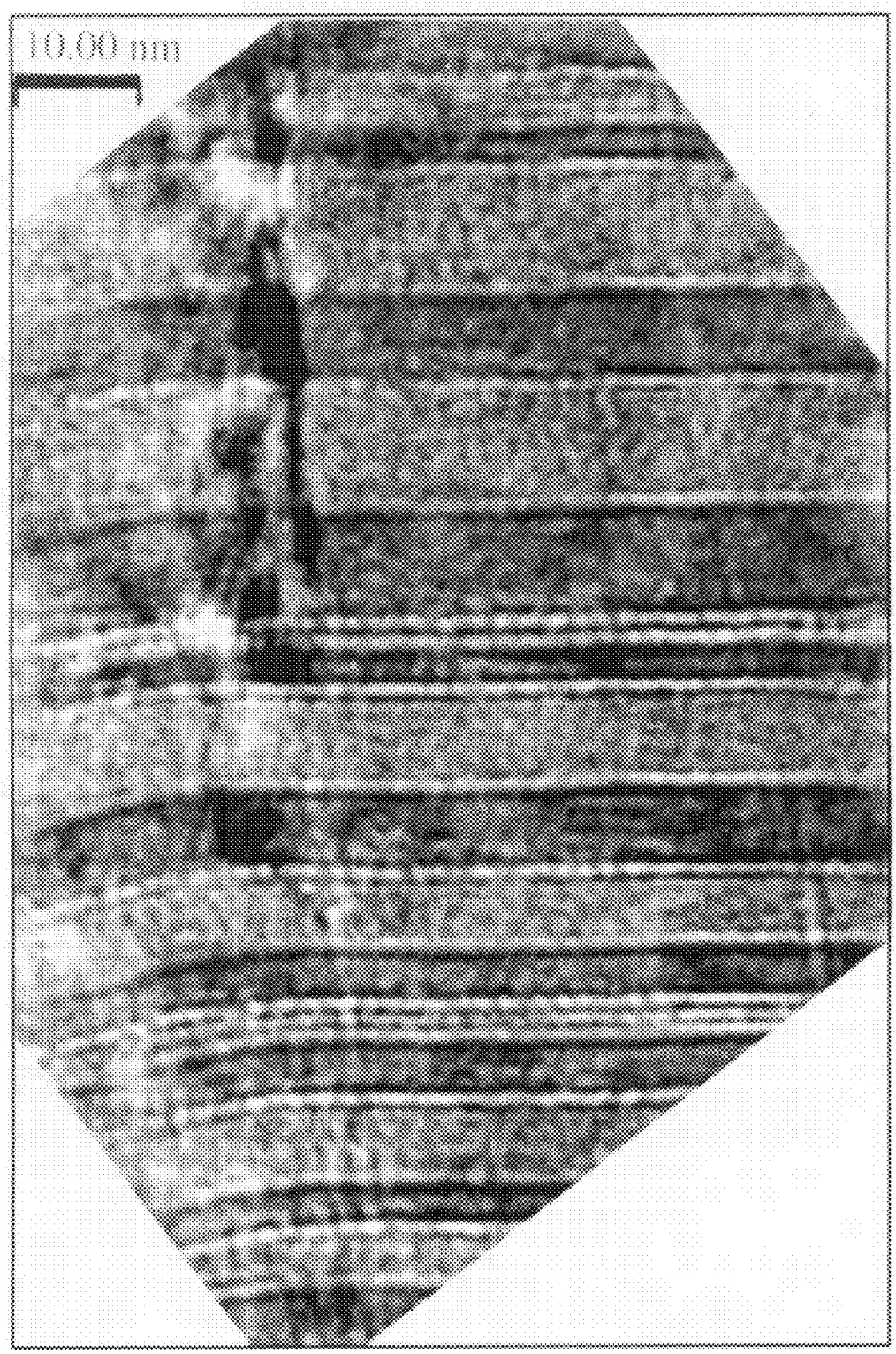
FIG. 1 shows a TEM picture of a multilayered nitride structure according to the present invention. The sequence of individual layer thicknesses is essentially aperiodic throughout the entire multilayer coating.

It has surprisingly been found that by providing a coating according to the present invention, an enhanced hardness leading to an increased abrasive wear resistance of the cutting edge, makes it possible to maintain a sharp cutting edge. It has also been found that the hard, thin coatings can be achieved without the homogeneous bottom layer as described in prior art. The obtained structure is fine grained with no or very little porosity at the grain boundaries. High magnification cross section transmission electron microscopy (TEM) indicates an aperiodic structure.

According to the present invention, there is provided a cutting tool comprising a substrate of a hard alloy of carbides, cermets, ceramics, cubic boronitride or high speed steels, onto which a wear resistant, multilayered coating has been deposited. Said substrate may also be precoated with a thin single- or multilayer of TiN, TiC, TiCN or (Ti, Al)N with a thickness of between from about 0.1 to about 1 μm, preferably from about 0.05 to about 0.5 μm.

Said multilayered coating, which is adherently bonded to the substrate, or to the pre-coated substrate, comprises a laminar, multilayered structure X+Y+X+Y+ . . . (see FIGS. 1 and 2) where the alternating layers X and Y comprise metalnitrides, metalcarbides or metalcarbonitrides, preferably polycrystalline nitrides, preferably having a cubic structure, with the metal elements selected from titanium (Ti), aluminium (Al), silicon (Si), chromium (Cr), niobium (Nb), hafnium (Hf), vanadium (V), tantalum (Ta), molybdenum (Mo), zirconium (Zr) or tungsten (W) and mixtures thereof. The chemical composition of layer X is different from that of Y.

The composition of each individual layer in the multilayered structure cannot be measured without contribution from adjacent layers due to the small thickness. What can be measured is the average composition over the whole multilayer structure. However, the composition of each individual layer can be estimated from the composition of the targets used but that does not give an exact composition. When thicker layers have been deposited, thick enough to be analyzed, it has been shown that the composition of the deposited layers can differ with a few percentage compared to the composition of the target material. Due to this, any composition of the individual layers of the multilayered structure according to the present invention mentioned herein after are estimations from the compositions of the targets used during the deposition.

The average chemical composition in the multilayered structure is measured using EDS (Energy Dispersive Spectroscopy) over a cross section of the coating. The average composition of the whole multilayered structure according to the present invention is preferably $Al_aTi_bSi_cCr_d(C_eN_{1-e})$ where a is greater than zero and less than about 0.5, preferably a is greater than about 0.05 and less than about 0.4, where b is greater than about 0.1 and less than about 0.9, preferably b is greater than about 0.3 and less than about 0.9, c is greater than about 0.01 and less than about 0.17, preferably is greater than about 0.02 and less than about 0.1, d is greater than or equal to zero and less about 0.06, and a+b+c+d=1, where e is equal to or greater than zero and less than about 1, preferably e is equal to or greater than zero and less than about 0.2. The composition of each layer, that is the target composition, can be outside the above described limits even if the average composition of the whole multilayered structure is within the limits.

The multilayered structure has a sequence of alternating X and Y layers with individual thicknesses that are aperiodic essentially throughout the entire multilayer structure. The thickness of any individual layer is larger than about 0.1 nm but smaller than about 100 nm, preferably larger than about 1 nm but smaller than about 50 nm, most preferably larger than about 2 nm but smaller than about 30 nm. The sum of any ten consecutive layers in the multilayered structure is smaller than about 300 nm.

By aperiodic is understood that the thickness of a particular individual layer in the multilayered structure does not depend on the thickness of an individual layer immediately beneath nor does it bear any relation to an individual layer above the particular individual layer. Hence, the multilayered structure does not have any repeat period in the sequence of individual layer thicknesses. The total thickness of the multilayered structure is from about 0.5 to about 20 μm, preferably from about 1 to about 10 μm, most preferably from about 1 to about 5 μm.

In one embodiment of the present invention, the coating comprises at least two, preferably at least five, multilayered structures which are repeatedly alternated with homogeneous layers. The multilayered structure is the same as described above with regard to thickness of the individual layers and chemical composition. The homogeneous layers preferably comprises $Ti_xAl_ySi_z(C_wN_{1-w})$ where x is greater than zero and less than about 0.7, preferably x is greater than about 0.05 and less than about 0.6, where y is greater than about 0.1 and less than about 0.9, preferably y is greater than about 0.3 and less than about 0.9, where z is greater than about 0.01 and less than about 0.17, preferably z is greater than about 0.02 and less than about 0.1, and x+y+z=1, where w is equal to or greater than zero and less than about 1, preferably w is equal to or greater than 0 and less than about 0.2. The thickness of the homogeneous layer is preferably from about 25 to about 150, more preferably from about 50 to about 75, nm. The composition of the whole coating is $Al_aTi_bSi_cCr_d(C_eN_{1-e})$ where a is greater than zero and less than about 0.5, preferably a is greater than about 0.05 and less than about 0.4, where b is greater than about 0.1 and less than about 0.9, preferably b is greater than about 0.3 and less than about 0.9, c is greater than about 0.01 and less than about 0.17, preferably is greater than about 0.02 and less than about 0.1, d is greater than or equal to zero and less about 0.06, and a+b+c+d=1, where e is equal to or greater than zero and less than about 1, preferably e is equal to or greater than zero and less than about 0.2. The total thickness of the coating, where the multilayered structures are repeatedly alternated with the homogeneous layers, is preferably from about 0.5 to about 20, more preferably from about 0.5 to about 10 and most preferably from about 1 to about 5 μm.

All coatings display a cubic NaCl-structure with pronounced (200)-texture, determined by using Bragg-Brentano x-ray diffraction. All multilayered coatings display stronger XRD peaks than the homogeneous coatings. The multilayered coatings displayed a more pronounced (200)-texture than coating alternating homogeneous layers with the multilayered structure.

Cutting tools onto which the multilayered coating is deposited, are for example end mills, drills, cutting tool inserts made from cemented carbide, cermet, ceramic, cubic boronitride or high speed steel.

The coatings comprising the multilayered structure can be deposited on a substrate by different PVD techniques and alternately forming individual layers. The aperiodic sequence of individual layer thicknesses can be fabricated by randomly opening and closing shutters from individual layer sources, or by randomly switching said sources on and off. Another conceivable method is by randomly rotating or moving the to-be-coated substrates, in front of said sources. This is preferably done by placing the substrates on a 3-fold rotating substrate table arranged in order to obtain the aperiodic structure. The 3-fold rotation can be adjusted with regard to rotating speed and rotating direction, clockwise or counter clockwise.

Electron beam evaporation, magnetron sputtering or cathodic arc deposition or combinations thereof, are the preferred PVD methods for depositing the coatings.

The arc sources can consist of different combinations of metals and the composition of the individual sources can be different from the average composition of the whole multilayered structure and still form coatings within the scope of the present invention. The number of sources is at least two.

In one embodiment of the present invention a multilayered coating comprising (Ti, Al, Si)N+(Ti, Si)N, (Ti, Si)N+(Ti, Al)N, (Al, Cr)N+(Ti, Si)N or (Al, Ti, Si)N+(Al, Cr)N is deposited onto a substrate of high speed steel, preferably a drill or end mill.

In another embodiment of the present invention a multilayered coating comprising ((Ti, Al, Si)N+(Ti, Si)N, (Ti, Si)N+(Ti, Al)N, (Al, Cr)N+(Ti, Si)N or (Al, Ti, Si)N+(Al, Cr)N is deposited onto a substrate of cemented carbide.

In addition to the coatings described above, the coatings according to the present invention can also comprise one or more top layers such as layers improving heat resistance and layers facilitating identification of wear.

The multilayered structure according to the present invention is particularly suitable for tool geometries with sharp cutting edges. The coated cutting tools according to the present invention exhibit improved wear resistance compared to prior art tools when used for machining steel or stainless steel.

Example 1

Coated inserts were made by depositing aperiodic multilayer structures using reactive PVD arc discharge evaporation onto cemented carbide turning inserts with a composition of 10 wt-% Co and balance WC. The multilayer structures were deposited from two arc sources with the inserts mounted on a 3-fold rotating substrate table arranged in order to obtain the aperiodic structure. The arc evaporation was performed in an Ar+$N_2$-atmosphere. The resulting total coating thickness was about 2 μm. Three different aperiodic multilayer structures were deposited. The composition of the two arc sources and the average chemical composition of the aperiodic multilayer structure are shown in Table 1. The multilayered structure was having a sequence of individual layers with an aperiodic, i.e. non-repetitive thickness. Cross section transmission electron microscopy investigation revealed that the individual nitride layer thicknesses ranged from 2 to 30 nm, and the total number of layers exceeded 100.

TABLE 1

| Coating No. | Source 1 | Source 2 | Average chemical composition |
|---|---|---|---|
| 1 | $Ti_{0.90}Si_{0.10}$ | $Al_{0.60}Ti_{0.30}Si_{0.10}$ | $Al_{0.19}Ti_{0.73}Si_{0.08}N$ |
| 2 | $Ti_{0.90}Si_{0.10}$ | $Al_{0.55}Ti_{0.40}Si_{0.05}$ | $Al_{0.16}Ti_{0.78}Si_{0.06}N$ |
| 3 | $Ti_{0.90}Si_{0.10}$ | $Al_{0.16}Ti_{0.84}$ | $Al_{0.06}Ti_{0.88}Si_{0.06}N$ |

Example 2

Coatings consisting of repeatedly alternated homogeneous layers and aperiodic multilayer structures were deposited by reactive PVD arc discharge evaporation onto turning inserts with a composition of 10 wt-% Co and balance WC. The multilayer structures were deposited from two arc sources with the inserts mounted on a 3-fold rotating substrate table arranged in order to obtain the aperiodic structure. The evaporation was performed in an Ar+$N_2$ gas mixture. The resulting total coating thickness was about 2 μm. The multilayered structure had a sequence of individual layers with an aperiodic, i.e. non-repetitive thickness. Cross section transmission electron microscopy investigation revealed that the individual nitride layer thicknesses ranged from 2 to 30 nm. The thicknesses of the homogeneous layers were between 25 and 150 nm. The composition of the arc sources and the average chemical composition of the whole coating are shown in Table 2. The homogeneous layers were formed from arc source 2 in Table 2.

TABLE 2

| Coating No. | Source 1 | Source 2 | Average chemical composition |
|---|---|---|---|
| 4 | $Ti_{0.90}Si_{0.10}$ | $Al_{0.60}Ti_{0.30}Si_{0.10}$ | $Al_{0.37}Ti_{0.55}Si_{0.08}N$ |
| 5 | $Ti_{0.90}Si_{0.10}$ | $Al_{0.55}Ti_{0.40}Si_{0.05}$ | $Al_{0.34}Ti_{0.60}Si_{0.06}N$ |

Example 3

The flank wear was tested in a turning operation with the following cutting conditions:

| | |
|---|---|
| Work piece material: | SS0737, ring with thick walls |
| Operation: | Continuous facing |
| Cutting speed m/min | 200 |
| Feed mm/r | 0.10 |
| Depth mm | 2 |
| Note: | Dry condition |

The operation continued until the whole outer diameter had been subjected to the turning operation. After that, the inserts were analyzed visually and categorized into poor, medium and good.

The multilayered structure was compared to coatings of homogeneous $Ti_{0.9}Si_{0.1}N$, homogeneous $Al_{0.51}Ti_{0.45}Si_{0.05}N$, homogeneous $Al_{0.56}Ti_{0.34}Si_{0.10}N$, and a coating consisting of a bottom layer of $Al_{0.50}Ti_{0.50}N$ and a top layer of $Ti_{0.09}Si_{0.1}N$. All coatings had the same total thicknesses as the multilayer. The results are shown in Table 3:

TABLE 3

| Type of coating | Flank Wear Resistance |
|---|---|
| Multilayered No 1 | Good |
| Multilayered No 2 | Good |
| Multilayered No 3 | Good |
| Multilayered No 4 | Medium |
| Multilayered No 5 | Medium |
| Homogeneous $Ti_{0.9}Si_{0.1}N$ | Poor |
| Homogeneous $Al_{0.51}Ti_{0.45}Si_{0.05}N$ | Poor |
| homogeneous $Al_{0.56}Ti_{0.34}Si_{0.10}N$ | Poor |
| Two layers $Al_{0.50}Ti_{0.50}N$ (bottom layer) $Ti_{0.9}Si_{0.1}N$ (top layer) | Poor |

Example 4

The multilayered coatings 1, 2 and 3 according to the present invention were tested for flaking resistance in a turning operation in stainless steel with the following cutting conditions:

| | |
|---|---|
| Work piece material: | 304L, Sanmac |
| Operation: | Facing, varying cutting depths |
| Cutting speed, m/min | 100/140 |
| Feed, mm/r | 0.35 |
| Depth, mm | 4-0-4 |
| Note: | Wet condition |

The flaking was measured by investigation in a SEM (scanning electron microscope).

The multilayered structure was compared to coatings of homogeneous $Ti_{0.09}Si_{0.1}N$, homogeneous $Al_{0.51}Ti_{0.45}Si_{0.05}N$, homogeneous $Al_{0.56}Ti_{0.34}Si_{0.10}N$, and a coating consisting of a bottom layer of $Al_{0.50}Ti_{0.50}N$ and a top layer of $Ti_{0.09}Si_{0.01}N$. All coatings had the same total thicknesses as the multilayer. The results are shown in Table 4:

TABLE 4

| Type of coating | Flaking Resistance |
|---|---|
| Multilayered No 1 | Good |
| Multilayered No 2 | Good |
| Multilayered No 3 | Good |
| Homogeneous $Ti_{0.9}Si_{0.1}N$ | Poor |
| Homogeneous $Al_{0.51}Ti_{0.45}Si_{0.05}N$ | Poor |
| homogeneous $Al_{0.56}Ti_{0.34}Si_{0.10}N$ | Poor |
| Two layers $Al_{0.50}Ti_{0.50}N$ (bottom layer) $Ti_{0.9}Si_{0.1}N$ (top layer) | Poor |

Example 5

The tool life for the tools coated with the multilayered structures 1-5 according to the present invention were tested in a turning operation in steel with the following cutting conditions:

| | |
|---|---|
| Work piece material: | Ovako 825B |
| Operation: | Longitudinal turning |
| Cutting speed m/min | 160 |
| Feed mm/r | 0.35 |
| Depth mm | 2 |
| Note: | Wet condition |

The tool life was measured in the distance in meters of turning operation. The tool life criterion was tool breakage.

The multilayered structure was compared to coatings of homogeneous $Ti_{0.09}Si_{0.1}N$, homogeneous $Al_{0.51}Ti_{0.45}Si_{0.05}N$ and homogeneous $Al_{0.56}Ti_{0.34}Si_{0.10}N$. All coatings had the same total thicknesses as the multilayer. The results are shown in Table 5:

TABLE 5

| Type of coating | Tool Life (m) |
|---|---|
| Multilayered No 1-3 | 20 |
| Multilayered No 4 and 5 | 22 |
| Homogeneous $Ti_{0.9}Si_{0.1}N$ | 16 |
| Homogeneous $Al_{0.51}Ti_{0.45}Si_{0.05}N$ | 5.5 |
| homogeneous $Al_{0.56}Ti_{0.34}Si_{0.10}N$ | 5.5 |

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. Cutting tool comprising a substrate of sintered cemented carbide or cermet, ceramic, cubic boronitride or high speed steel comprising a thin, adherent, hard and wear resistant coating, said coating comprising a laminar, multilayered structure of alternating layers of refractory compounds in non-repetitive form, X+Y+X+Y+X . . . where the alternating layers X and Y are composed of polycrystalline nitrides having a cubic structure, wherein the nitrides are metalnitrides, metalcarbides or metalcarbonitrides, the sequence of individual layer thicknesses having no repeat period but being essentially aperiodic throughout the entire multilayered structure wherein said individual X or Y layer thickness is larger than about 0.1 nm but smaller than about 100 nm, varying essentially at random, and the total thickness of said multilayered coating is from about 0.5 μm to about 20 μm, the multilayered structure having an average chemical composition of $Al_aTi_bSi_cCr_d(C_eN_{1-e})$ where a is greater than zero and less than about 0.5, b is greater than about 0.1 and less than about 0.9, c is greater than about 0.01 and less than about 0.17, d is equal to or greater than zero and less than about 0.06, and a+b+c+d=1, where e is equal to or greater than 0 and less than about 1, wherein said coating comprise homogeneous layers which are repeatedly alternated with multilayered structures, where the homogeneous layers comprise metalnitrides, metalcarbides or metalcarbonitrides or mixtures thereof, and where the average chemical composition of the coating is $Al_aTi_bSi_cCr_d(C_eN_{1-e})$ where a is greater than zero and less than about 0.5, b is greater than about 0.1 and less than about 0.9, c is greater than about 0.01 and less than about 0.17, where d is greater than zero and less than about 0.06, and a+b+c+d=1, where e is equal to or greater than zero and less than about 1.

2. Cutting tool of claim 1 wherein the layers X and Y are nitrides of metal elements selected from Ti, Cr, Al and Si and mixtures thereof.

3. Cutting tool of claim 1 wherein the multilayered structure X+Y+X+Y+X . . . is any of the following combinations (Al,Ti,Si)N+(Ti,Si)N, (Ti,Si)N+(Al,Ti)N, (Al,Cr)N+(Ti,Si)N and (Al,Ti,Si)N+(Al,Cr)N.

4. Cutting tool of claim 1 wherein the homogeneous layers have a composition of $Al_xTi_ySi_z(C_wN_{1-w})$ where x is greater than zero and less than about 0.7, y is greater than about 0.1 and less than about 0.9, z is greater than about 0.01 and less than about 0.17, and x+y+z=1, where w is equal to or greater than zero and less than about 1.

5. Cutting tool of claim 1 wherein the homogeneous layer has an average thickness of from about 25 to about 150 nm.

6. Cutting tool of claim 1 wherein the thickness of the coating is from about 0.5 μm to about 20 μm.

7. Cutting tool of claim 1 wherein said individual X or Y layer thickness is larger than about 1 nm but smaller than about 50 nm, the total thickness of said multilayered coating is from about 1 to about 10 μm, a is greater than about 0.05 and less than about 0.4, b is greater than about 0.3 and less than about 0.9, c is greater than about 0.02 and less than about 0.1 and e is greater than or equal to 0 and less than about 0.2.

8. Cutting tool of claim 7 wherein said individual X or Y layer thickness are from about 2 and about 30 nm and the total thickness of said multilayered coating is from about 1 to about 5 μm.

9. Cutting tool of claim 1 wherein in the average chemical composition of said coating, a is greater than about 0.05 and less than about 0.4, b is greater than about 0.3 and less than about 0.9, c is greater than about 0.02 and less than about 0.1 and e is greater than or equal to 0 and less than about 0.2.

10. Cutting tool of claim 4 wherein in the composition of said homogenous layers, x is greater than about 0.05 and less than about 0.6, y is greater than about 0.3 and less than about 0.9, z is greater than about 0.02 and less than about 0.1 and w is greater than or equal to 0 and less than about 0.2.

11. Cutting tool of claim 5 wherein the homogenous layer has an average thickness of from about 50 to about 75 nm.

12. Cutting tool of claim 6 wherein the total thickness of the coating is from about 1 to about 10 μm.

13. Cutting tool of claim 6 wherein the total thickness of the coating is from about 1 to about 5 μm.

14. Cutting tool of claim 1 wherein said individual X or Y layer thickness is larger than about 1 nm but smaller than about 50 nm.

15. Cutting tool of claim 1 wherein said individual X or Y layer thickness is larger than about 2 nm but smaller than about 50 nm.

16. Cutting tool comprising a substrate of sintered cemented carbide or cermet, ceramic, cubic boronitride or high speed steel comprising a thin, adherent, hard and wear resistant coating, said coating comprising a laminar, multi-layered structure of alternating layers of refractory compounds in non-repetitive form, X+Y+X+Y+X . . . where the alternating layers X and Y are composed of polycrystalline nitrides having a cubic structure, wherein the nitrides are metalnitrides, metalcarbides or metalcarbonitrides, the sequence of individual layer thicknesses having no repeat period but being essentially aperiodic throughout the entire multilayered structure wherein said individual X or Y layer thickness is larger than about 0.1 nm but smaller than about 100 nm, varying essentially at random, and the total thickness of said multilayered coating is from about 0.5 μm to about 20 μm, the multilayered structure having an average chemical composition of $Al_aTi_bSi_cCr_d(C_eN_{1-e})$ where a is greater than zero and less than about 0.5, b is greater than about 0.1 and less than about 0.9, c is greater than about 0.01 and less than about 0.17, d is equal to or greater than zero and less than about 0.06, and a+b+c+d=1, where e is equal to or greater than 0 and less than about 1, wherein the multilayered structure X+Y+X+Y+X . . . is any of the following combinations (Al,Ti,Si)N+(Ti,Si)N, (Ti,Si)N+(Al,Ti)N, (Al,Cr)N+(Ti,Si)N and (Al,Ti,Si)N+(Al,Cr)N.

17. Cutting tool of claim 16, wherein d is greater than zero and less than about 0.06; and wherein the multilayered structure X+Y+X+Y+X . . . is any of the following combinations (Al,Cr)N+(Ti,Si)N and (Al,Ti,Si)N+(Al,Cr)N.

* * * * *